United States Patent [19]

Inoue

[11] 4,380,824
[45] Apr. 19, 1983

[54] RECEIVING REPRODUCING SYSTEM

[75] Inventor: Takao Inoue, Kodaira, Japan

[73] Assignee: Hitachi, Ltd., Tokyo, Japan

[21] Appl. No.: 233,869

[22] Filed: Feb. 12, 1981

[30] Foreign Application Priority Data

Apr. 18, 1980 [JP] Japan .................... 55-50381

[51] Int. Cl.³ .................... H04B 1/10; H03G 3/24
[52] U.S. Cl. .................... 455/143; 179/1 P; 179/1 VE; 179/1 VL; 455/212; 455/219; 455/238; 455/247; 455/297
[58] Field of Search .................... 179/1 P, 1 VE, 1 VL; 455/235, 238, 246, 247, 297, 345, 212, 219, 155, 296, 142, 143

[56] References Cited

U.S. PATENT DOCUMENTS

| 2,409,058 | 10/1946 | Mitchell | 455/238 |
|---|---|---|---|
| 3,374,437 | 3/1968 | Heald | 455/212 |
| 3,497,622 | 2/1970 | Markin et al. | 179/1 |
| 3,673,499 | 6/1972 | Avins et al. | 455/155 |
| 3,679,979 | 7/1972 | Krepps, Jr. et al. | 455/155 |
| 3,821,649 | 6/1974 | Grosjean | 455/155 |
| 4,037,057 | 7/1977 | Ogita et al. | 179/1 GJ |
| 4,061,874 | 12/1977 | Fricke et al. | 179/1 P |
| 4,198,603 | 4/1980 | Aldridge et al. | 179/1 VL |
| 4,254,303 | 3/1981 | Takizawa | 179/1 P |

FOREIGN PATENT DOCUMENTS

| 1282746 | 11/1968 | Fed. Rep. of Germany. |
|---|---|---|
| 2403986 | 7/1975 | Fed. Rep. of Germany. |
| 2522381 | 12/1976 | Fed. Rep. of Germany. |
| 2648901 | 5/1978 | Fed. Rep. of Germany. |
| 2118350 | 10/1978 | Fed. Rep. of Germany. |
| 2361651 | 1/1979 | Fed. Rep. of Germany. |
| 2743720 | 4/1979 | Fed. Rep. of Germany. |
| 2934593 | 2/1980 | Fed. Rep. of Germany. |
| 485005 | 5/1938 | United Kingdom. |
| 2029141 | 3/1980 | United Kingdom. |
| 1564282 | 4/1980 | United Kingdom. |
| 2042836 | 9/1980 | United Kingdom. |

OTHER PUBLICATIONS

Electronik Praxis-"Ein Filter Hoher Güte mit Negativimpedanz"and Geräuschgesteuerte Lautstärke-Einstellschaltung, Ullrich Bollinger-May 1976, No. 5, p. 104.

Primary Examiner—Marc E. Bookbinder
Attorney, Agent, or Firm—Antonelli, Terry & Wands

[57] ABSTRACT

A receiving reproducing system for an automotive radio detects the surrounding noise level other than the output sound thereof, in the sound field extending in the passenger compartment of an automobile, and the level which is dependent upon the received signal level of an antenna. The receiving reproducing system partly controls its output sound volume proportionally in accordance with the surrounding noise level and partly lowers its output sound volume in dependence upon the reduction in the received signal level. Even under the circumstances where the surrounding noise level is high and where the received signal level is low, the sound volume of the output sound containing many noises can be prevented from being raised.

5 Claims, 8 Drawing Figures

RECEIVING REPRODUCING SYSTEM

BACKGROUND OF THE INVENTION

The present invention relates to a receiving reproducing system of the type which may be carried on a vehicle, such as an automobile.

In a sound field extending in the passenger compartment of an automobile, the surrounding noises other than the sounds generated by the automotive radio receiver, tend to change significantly in volume. For this reason, there has been proposed an automatic sound volume control system for detecting those surrounding noises and for controlling the output volume of the radio receiver proportionally in accordance with the detected noise level, as disclosed in Japanese Laid-Open Patent Publication No. 82955/1979.

SUMMARY OF THE INVENTION

It has been clearly found by our investigations that, if the sound volume control is performed by the aforementioned automatic sound volume control system according to the prior art under the circumstances where the receiving condition is bad (e.g., in the case where the automobile is running through a tunnel), the output volume of audio signals containing many noises are augmented to promote the uncomfortable feeling of the listener.

It is therefore an object of the present invention to provide a receiving reproducing system which can effect the automatic sound volume control of such a high quality as is free from making the listener uncomfortable.

DESCRIPTION OF THE PREFERRED EMBODIMENTS

The present invention will be described in detail in connection with the embodiments thereof, as follows.

Figure 1:
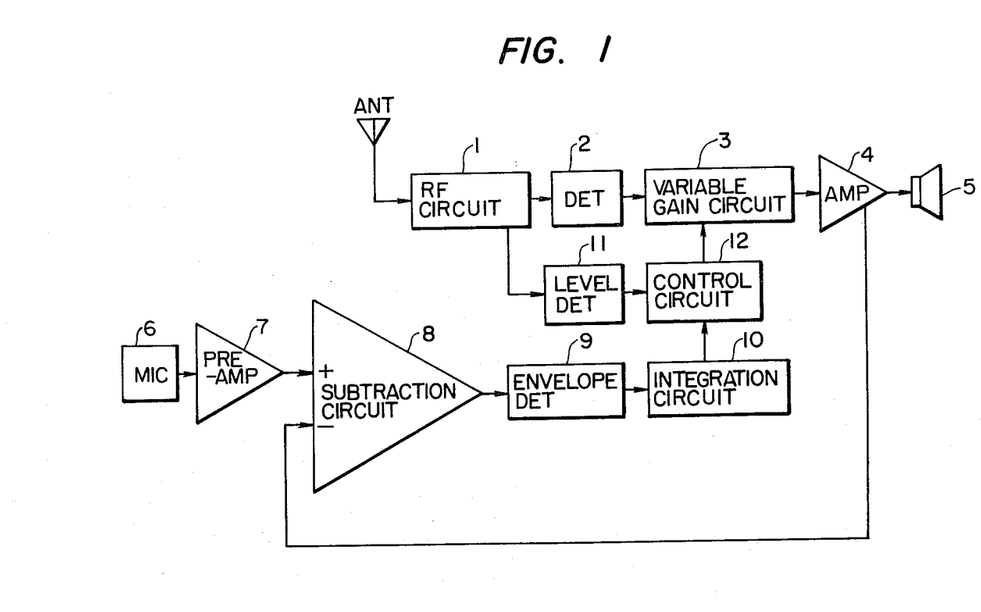
FIG. 1 is a block diagram showing a receiving reproducing system according to a principal embodiment of the present invention.

FIG. 1 is a block diagram showing a receiving reproducing system to be carried in an automobile in accordance with the principal embodiment of the present invention.

The radio frequency signal received by an antenna ANT is transmitted to the input of a radio-frequency circuit 1 which is composed of a high-frequency tuning amplifier, a local oscillator, a mixer and an intermediate-frequency amplifier. A detector 2 for detecting the intermediate-frequency amplified output of the circuit 1 has its output amplified by a low-frequency power amplifier 4 and transmitted to a speaker 5. In order to control the output sound volume impressed upon the speaker 5 in proportion to the surrounding noise level of the sound field, an audio signal produced by the aforementioned detector 2 is impressed upon the low-frequency power amplifier 4 through a variable gain circuit 3, and this variable gain circuit 3 is controlled by a signal which is proportional to the surrounding noise level of the sound field.

The signal level which is dependent upon the noise level in the sound field, i.e., both the audio output generated by the speaker 5 and the surrounding noises converted into an electric signal by a microphone 6 and this signal is then amplified by a pre-amplifier 7. The output signal of the pre-amplifier 7 and the audio output signal of the low-frequency power amplifier 4 are applied to respective inputs of a subtraction circuit 8, which is composed of an operational amplifier, so that the audio signal is offset and only the surrounding noise component appears at the output of the subtraction circuit 8. The output signal of this subtraction circuit 8 is converted into a DC signal by the action of an envelope detector 9 and an integrating circuit 10 so that the control signal of the aforementioned variable gain circuit 3 is produced.

The noise detector, which is composed of the microphone 6, the pre-amplifier 7, the subtraction circuit 8, the envelope detector 9 and the integration circuit 10, has its output signal transmitted under normal conditions to the variable gain circuit 3 through a control circuit 12. As a result, the gain of the variable gain circuit 3 is controlled so that the level of the audio signal to be impressed upon the speaker 5 varies in proportion to the surrounding noise level of the sound field.

Thus, in the case where the surrounding noise level of the sound field is high, an audio output signal at a high level is fed to the speaker 5 from the output terminal of the power amplifier 4. In the case where the surrounding noise level of the sound field is relatively low, on the other hand, an audio output signal at a relatively-low level is fed to the speaker 5.

In accordance with the inventive concept of the present invention, a received level detector 11 for detecting the level which is dependent upon the received signal level of the antenna ANT is connected with the high-frequency circuit 1. The output signal of the received level detector 11 is impressed upon the aforementioned control circuit 12 so that the output signal of that received level detector 11 so controls the variable gain circuit 3 in dependence upon the reduction in the received signal level of the antenna ANT that the level of the output signal of the power amplifier 4 which is impressed upon the speaker 5 is lowered.

According to the preferred embodiment, the control circuit 12 lowers the level of the output signal of the power amplifier 4, which is impressed upon the speaker 5, only in the case where the output signal of the received level detector 11 becomes lower than a predetermined reference value. This reference value is so set that the control circuit 12 operates to lower the level of the output signal to be impressed upon the speaker 5, for example, in case the automobile is running in a tunnel where the received signal level of the antenna ANT is remarkably weak and where the detected output of the detector 2 substantially contains only the noise component of the received signal.

Thus, under the received condition having a weak field strength but high surrounding noise, e.g., under the conditions of reception in a tunnel, the sound volume to be generated by the speaker can be muted without raising the output sound volume. As a result, the noise contained in the received signals can be prevented from being amplified at a high gain and transmitted to the speaker, with the result that an automatic sound volume control of high quality can be realized.

The present invention should not be limited to the embodiment thus-far described but is susceptible of various modifications. For example, the gain of the variable gain circuit 3 may be forcibly limited to a remarkably-low preset value by the output of the control circuit 12 or the transmission of the aforementioned control signal to the variable gain circuit 3 may be prohibited so as to stop the automatic sound volume control, with a result that a sound volume output at a manually-set low level is generated by the speaker 5.

On the other hand, the specific circuit components thus-far described may be of any type. For example, the received level detector 11 may be used as a tuning meter driver if the latter is contained in the radio receiving reproducing system.

Figure 2A:
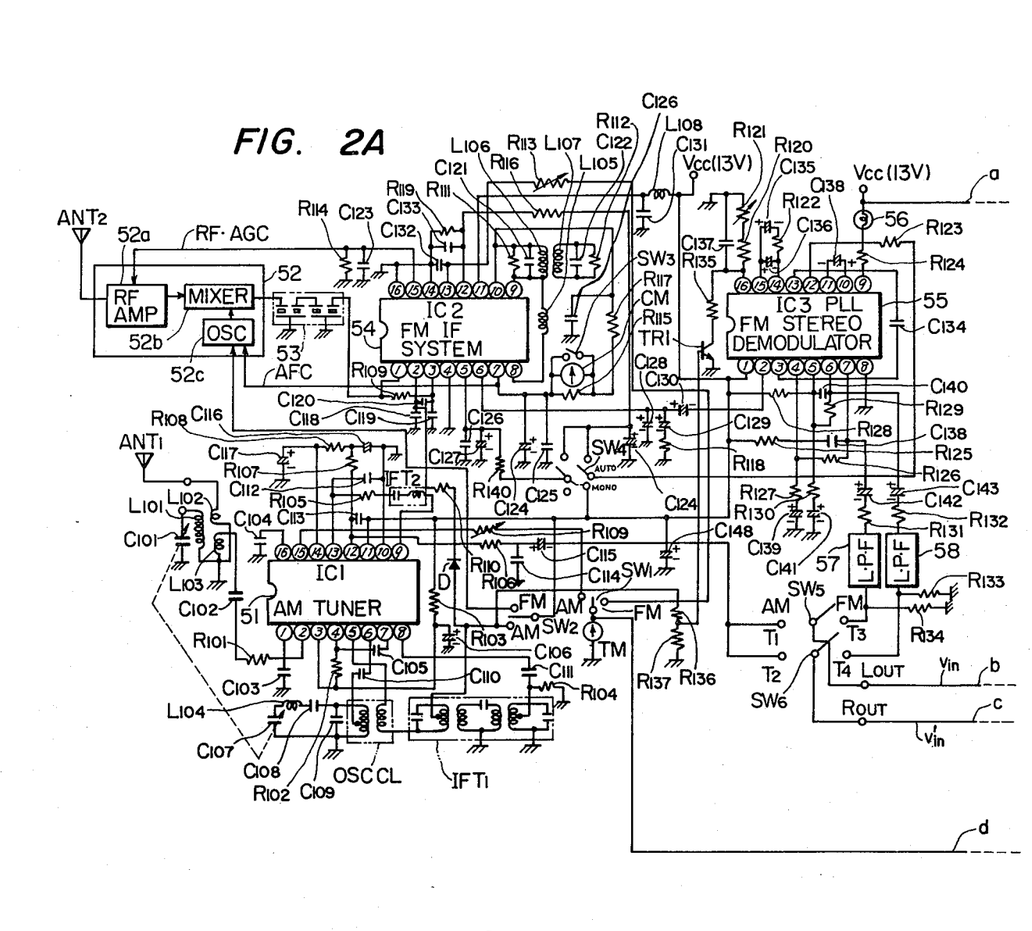
FIGS. 2A and 2B are block diagrams showing the receiving reproducing system according to a preferred embodiment of the present invention.
Figure 2B:
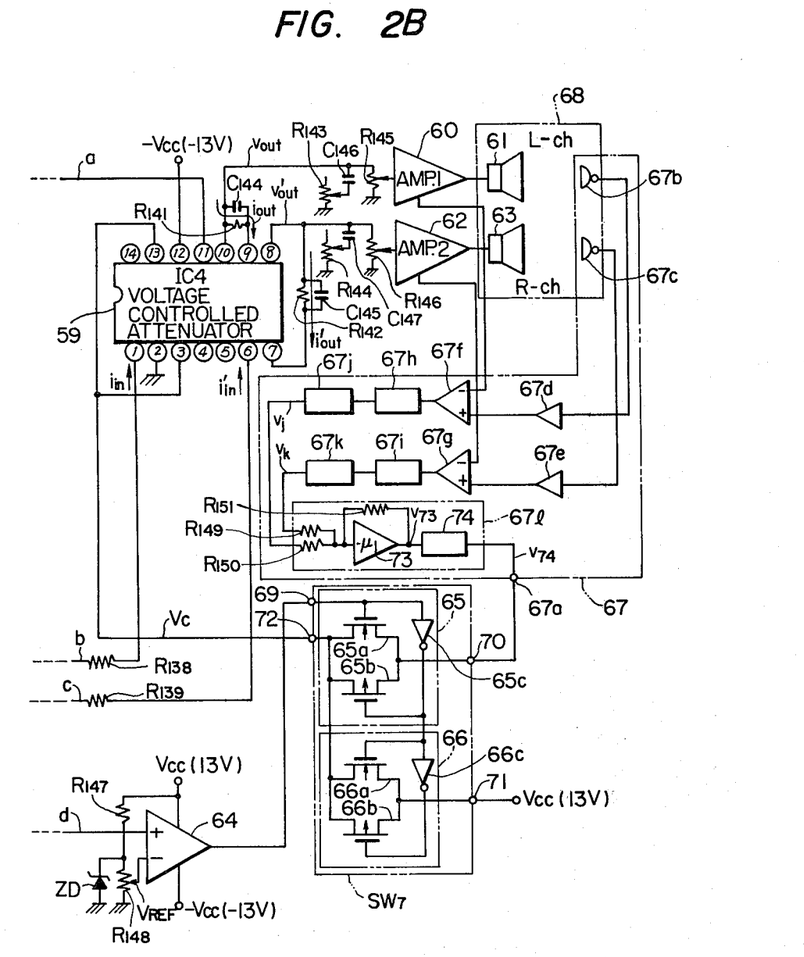

FIGS. 2A and 2B show the circuit diagrams of an FM/AM receiving reproducing system of the type which may be carried in an automobile, in accordance with a preferred embodiment of the present invention.

The AM radio-frequency signal received by an AM antenna $ANT_1$ is impressed upon a second terminal of a first semiconductor integrated circuit IC1 through an AM antenna tuning circuit which is composed of condensers $C_{101}$ and $C_{102}$, coils $L_{101}$, $L_{102}$ and $L_{103}$ and a resistor $R_{101}$. The first semiconductor integrated circuit IC1 is an integrated circuit for an AM tuner and can be provided as an integrated circuit of the type HA1197, which is sold by Hitachi, Ltd., of Japan.

Figure 3:
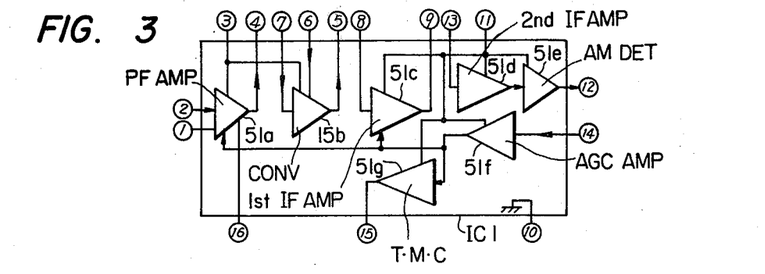
FIG. 3 is a block diagram showing the internal circuit of a first semiconductor integrated circuit to be used in the embodiment shown in FIGS. 2A and 2B.

FIG. 3 shows the internal circuit block of that first semiconductor integrated circuit IC1. This first semiconductor integrated circuit IC1 is equipped with an RF amplifier 51a, a frequency converter 51b, a first intermediate-frequency amplifier 51c, a second intermediate-frequency amplifier 51d, an AM detector 51e, an AGC (automatic gain control) amplifier 51f and a tuning meter circuit 51g. The RF amplifier 51a has its input terminal led out as the second terminal to the outside of the integrated circuit and its output terminal likewise led out as a fourth terminal to the outside of the integrated circuit. The RF amplifier 51a is further equipped with first and sixteenth terminals for AC grounding. As shown in FIG. 2A, these first and sixteenth terminals are connected at the outside of the integrated circuit to ground potential through condensers $C_{103}$ and $C_{104}$. The fourth terminal of the RF amplifier 51a acting as the output terminal thereof is connected through a condenser $C_{105}$ with a seventh terminal acting as the input terminal of the frequency converter 51b. That fourth terminal is connected with a third terminal through a resistor $R_{102}$.

This third terminal is connected to a positive power source voltage $V_{cc}$ through a power source lip filter which is composed of a resistor $R_{103}$ and a condenser $C_{106}$. By this positive power source voltage $V_{cc}$ fed to the third terminal, the RF amplifier 51a and the frequency converter 51b are operated. Between fifth and sixth terminals, there are connected an oscillation coil OSC CL, condensers $C_{107}$, $C_{108}$, $C_{109}$, and $C_{110}$ and a coil $L_{104}$, which are constructed as a part of the frequency converter 51b for determining the local oscillation frequency of the local oscillator. The output terminal of the frequency converter 51b is led out as the fifth terminal to the outside of the integrated circuit.

The first intermediate-frequency amplifier 51c has its input and output terminals led out as eighth and ninth terminals, respectively, to the outside of the integrated circuit. The eighth and fifth terminals are connected through the oscillation coil OSC CL, a first intermediate-frequency transformer $IFT_1$, a resistor $R_{104}$ and a condenser $C_{111}$.

The second intermediate-frequency amplifier 51d has its input terminal led out as a thirteenth terminal to the outside of the integrated circuit. The ninth and thirteenth terminals are connected through a second intermediate-frequency transformer $IFT_2$ and a resistor $R_{105}$. The thirteenth terminal is further connected to ground potential through a condenser $C_{112}$. The output of the second intermediate-frequency amplifier 51d is impressed upon the input terminal of the AM detector 51e in the integrated circuit.

A twelfth terminal acting as the output terminal of the AM detector 51e is led out to the outside of the integrated circuit. The twelfth terminal is connected with AM detection output terminals $T_1$ and $T_2$ through an output circuit which is composed of a resistor $R_{106}$ and condensers $C_{114}$ and $C_{115}$. The twelfth terminal is also connected to positive power source voltage $V_{cc}$ through a condenser $C_{113}$.

The AGC amplifier 51f constructed as a direct-current amplifier has its input terminal led out as a fourteenth terminal to the outside of the integrated circuit. Between the twelfth and fourteenth terminals, there is connected a time constant circuit, which is composed of resistors $R_{107}$ and $R_{108}$ and condensers $C_{116}$ and $C_{117}$, so that an AGC voltage is generated at the node between the resistor $R_{108}$ and the condenser $C_{117}$. The AGC voltage thus generated is impressed upon the fourteenth terminal (i.e., the input terminal of the AGC amplifier 51f) so that an AGC amplified voltage is generated at the output terminal of the AGC amplifier 51f. The AGC amplified voltage thus generated is applied to the RF amplifier 51a and the first intermediate-frequency amplifier 51c so that the AGC (automatic gain control) operation is carried out while controlling the gains of those amplifiers 51a and 51c.

The tuning meter circuit 51g is an impedance converter of the emitter follower circuit type and has its input connected to receive the aforementioned AGC amplified voltage so that a tuning meter drive voltage is generated at a fifteenth terminal. The tuning meter drive voltage thus generated is impressed upon a tuning meter TM through a variable resistor $R_{109}$ and a first change-over switch $SW_1$.

By connecting an eleventh terminal to the positive power source voltage $V_{cc}$, on the other hand, the first intermediate-frequency amplifier 51c, the second intermediate-frequency amplifier 51d, the AM detector 51e, the AGC amplifier 51f and the tuning meter circuit 51g are operated at that positive power source voltage $V_{cc}$. Incidentally, the AM tuner semiconductor integrated circuit of this kind is disclosed in detail in Japanese Patent Publication No. 53-45250 and U.S. Pat. No. 4,030,035, which were granted to the Applicant.

On the other hand, the FM radio-frequency signal received by an FM antenna $ANT_2$ is amplified by the RF amplifier 52a, which forms part of an FM front end 52, and is impressed upon a mixer 52b. This mixer 52b is connected to receive the local oscillation signal which is generated by a local oscillator 52c. Thus, the FM intermediate-frequency signal is obtained from the output terminal of the mixer 52b and is impressed upon a ceramic filter 53.

Figure 4:
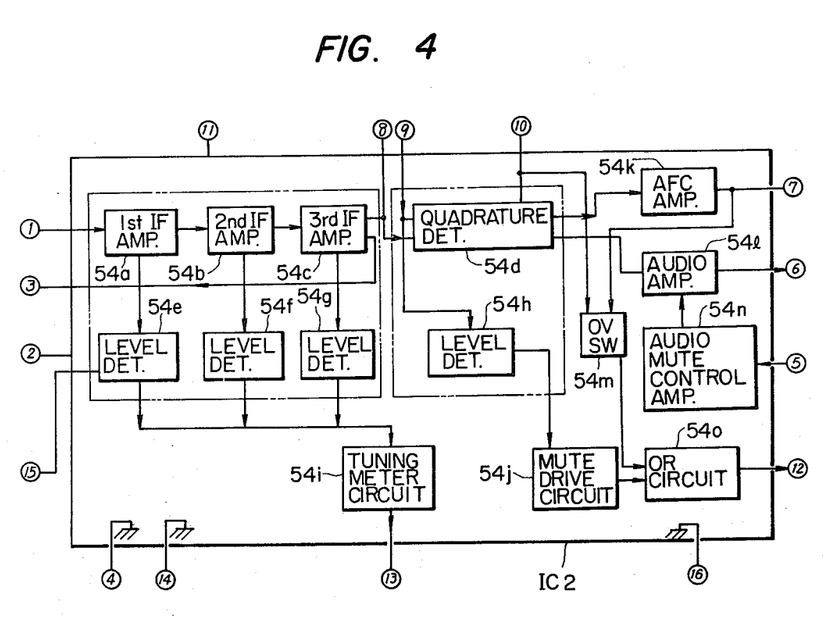
FIG. 4 is a block diagram showing the internal circuit of a second semiconductor integrated circuit to be used in the embodiment shown in FIGS. 2A and 2B.

A second semiconductor integrated circuit IC2 is a semiconductor integrated circuit for processing the FM intermediate-frequency signal and can make use of an integrated circuit of the type HA1137W which is sold by Hitachi, Ltd., of Japan. FIG. 4 shows the internal circuit block of that second semiconductor integrated circuit IC2. This second semiconductor integrated circuit IC2 is equipped with a first intermediate-frequency amplifier 54a, a second intermediate-frequency amplifier 54b, a third intermediate-frequency amplifier 54c, a guadrature detector 54d, a first level detector 54e, a second level detector 54f, a third level detector 54g, a fourth level detector 54h, a tuning meter circuit 54i, a mute drive circuit 54j, an AFC amplifier 54k, an audio amplifier 54l, a zero volt switch circuit 54m, an audio mute control amplifier 54n and an OR circuit 54o.

The second semiconductor integrated circuit IC2 has its first terminal acting as an input terminal which is connected to receive the FM intermediate-frequency signal through the aforementioned ceramic filter 53. That FM intermediate-frequency signal is amplified by the first, second and third intermediate-frequency amplifiers 54a, 54b and 54c which are connected in cascade. These intermediate-frequency amplifiers connected in cascade operate as an FM limiter, by which the undesired AM signal component contained in the FM intermediate-frequency signal can be removed.

Second and third terminals are connected to ground potential through condensers $C_{118}$ and $C_{119}$, respectively, and a condenser $C_{120}$ is connected between the second and third terminals. A resistor $R_{109}$ is connected between the first and third terminals so that a negative feedback is effected from the third intermediate-frequency amplifier 54c to the first intermediate-frequency amplifier 54a. The second terminal is further connected with a second change-over switch $SW_2$ through a resistor $R_{110}$ and a diode D.

The output signal of the third intermediate-frequency amplifier 54c is impressed upon the input of the quadrature detector 54d. A phase shift circuit is constructed of a network which is composed of coils $L_{105}$, $L_{106}$, and $L_{107}$, condensers $C_{121}$, $C_{122}$ and resistors $R_{111}$ and $R_{112}$ and which is connected with eighth, ninth and tenth terminals of the second semiconductor integrated circuit IC2. The phase shift circuit constitutes an FM detector together with the quadrature detector 54d. An FM detector of this kind is reported on pages 60–65, Volume BTR-13 Number 3, *IEEE Transactions on Broad Cast and Television Receivers*, which was published in November, 1967.

The first intermediate-frequency amplifier 54a, the second intermediate-frequency amplifier 54b, the third intermediate-frequency amplifier 54c and the ninth terminal are connected with the first level detector 54e, the second level detector 54f, the third level detector 54g and the fourth level detector 54h, respectively. These level detectors detect the peak value of the received signal.

The outputs of the first, second and third level detectors 54e, 54f and 54g are impressed upon the tuning meter circuit 54i. The output of this tuning meter circuit 54i is led out as a thirteenth terminal to the outside of the integrated circuit. The tuning meter drive voltage from that thirteenth terminal is impressed upon the tuning meter TM through a variable resistor $R_{113}$ and the first change-over switch $SW_1$. The intermediate-frequency amplifiers 54a to 54c, detector 54d, level detectors 54e to 54h and tuning meter circuit 54i are described in U.S. Pat. Nos. 3,673,499 and 3,701,022.

The other output of the aforementioned first level detector 54e is impressed as an automatic gain control voltage on the RF amplifier 52a of the FM front end 52 through a fifteenth terminal. Between this fifteenth terminal and ground potential there are connected a resistor $R_{114}$ and a condenser $C_{123}$ in parallel with each other.

The quadrature detector 54d has its first output signal impressed upon the automatic frequency control amplifier 54k which in turn has its output signal applied to the local oscillator 52c of the FM front end 52 through a seventh terminal. Thus, since the frequency of the local oscillation signal obtained by the local oscillator 52c is controlled, the FM tuner can perform its stabilized tunig operation without being detuned from a preset radio-frequency signal.

The second output signal of the quadrature detector 54d is a stereo composite signal acting as an FM detection output signal and is transmitted to a sixth terminal of the audio amplifier 54l.

Both the voltage at the seventh terminal and the voltage at the tenth terminal are impressed upon the zero volt switch circuit 54m. The inter-terminal differential voltage $V_7-V_{10}$ between the seventh and tenth terminals is reduced to zero at the S-letter characteristic center frequency of the FM detector which is composed of the aforementioned phase shift circuit and the quadrature detector 54d. The absolute value of that inter-terminal differential voltage is proportional to the detuned frequency, and the positive and negative polarities of the differential voltage are determined in dependence upon whether the detuned frequency is higher or lower than the aforementioned center frequency. Thus, between those seventh and tenth terminals, there is arranged at the outside of the integrated circuit a network which is composed of a center meter CM, resistors $R_{115}$ and $R_{117}$, condensers $C_{124}$, $C_{125}$ and $C_{126}$, and a third changeover switch $SW_3$.

On the other hand, in case the detuned frequency from the aforementioned center frequency is within a preset range, and in case the absolute value of the inter-terminal differential voltage between the seventh and tenth terminals is equal to or lower than a preset value, the aforementioned zero volt switch circuit 54m feeds the OR circuit 54o with an output signal at such a low level as is substantially equal to the ground potential. When the frequency detuned from the aforementioned center frequency exceeds the range of the aforementioned preset value, the aforementioned zero voltage switch circuit 54m feeds the OR circuit 54o with an output signal at a high level.

The output of the fourth level detector 54h is applied to the mute drive circuit 54j. In case the level of the FM intermediate-frequency signal to be applied to the first terminal is equal to or higher than a preset value, the mute drive circuit 54j feeds the OR circuit 54o with an output signal at a low level. When the level of the FM intermediate-frequency signal to be impressed upon the first terminal becomes equal to or lower than the aforementioned preset value so that the signal-to-noise ratio is remarkably deteriorated, the mute drive circuit 54j feeds the OR circuit 54o with an output signal at a high level.

When at least one of the outputs of the zero volt switch circuit 54m and the mute drive circuit 54j generates an output voltage at a high level, the OR circuit 54o transmits the output voltage at the high level to a twelfth terminal. If both of the outputs of the zero volt switch circuit 54m and the mute drive circuit 54j are at the low level, the voltage at the twelfth terminal takes the low level.

The twelfth terminal acting as the output terminal of the OR circuit 54o is connected at the outside of the integrated circuit with a fifth terminal through a resistor $R_{116}$, a fourth change-over switch $SW_4$ and a resistor $R_{140}$. The node between the resistor $R_{116}$ and the fourth change-over switch $SW_4$ is connected with the ground potential through a condenser $C_{124}$, whereas the fifth terminal is connected with the node potential through parallel condensers $C_{126}$ and $C_{127}$.

The fifth terminal is led out as the control input terminal of the audio mute control amplifier 54n to the outside of the integrated circuit. When the fifth terminal is fed with the voltage at the high level, the output of the audio mute control amplifier 54n effect such a control that the gain of the audio amplifier 54l is brought into a substantial zero condition. On the other hand, when the fifth terminal is fed with the voltage at the low level, the gain of the audio amplifier 54l is controlled to its maximum.

The fourth change-over switch $SW_4$ is usually closed to the AUTO side. Under this condition, the voltage of the twelfth terminal is transmitted to the fifth terminal. As a result, either in case the frequency detuned from the aforementioned center frequency is under the condition exceeding the aforementioned preset range or in case the FM intermediate-frequency signal to be applied to the first terminal is equal to or lower than the aforementioned preset value so that the signal-to-noise ratio is under its remarkably-low condition, the fifth terminal is fed with the voltage at the high level. Thus, in this case, the gain of the audio smplifier 54l is substantially reduced to zero. As a result, no stereo composite signal appears at the sixth terminal so that the audio mute operation is carried out. In case neither of the aforementioned two conditions are satisfied, the voltage at the fifth terminal takes the low level so that the stereo composite output signal of the quadrature detector 54d is transmitted to the sixth terminal through the audio amplifier 54l which has maximum gain.

The sixth terminal is connected with an output network which is composed of condensers $C_{128}$, $C_{129}$ and $C_{130}$, and a resistor $R_{118}$. Fourth, fourteenth and sixteenth terminals are ground terminals and are directly connected to ground potential.

An eleventh terminal is a power source supply terminal and is connected with the positive power source voltage $V_{cc}$ through a lip filter which is composed of a coil $L_{108}$ and a condenser $C_{131}$. The thirteenth terminal is connected with the ground potential through a condenser $C_{132}$, whereas the twelfth terminal is connected with the ground potential through a condenser $C_{133}$ and a resistor $R_{119}$, which are connected in parallel.

Figure 5:
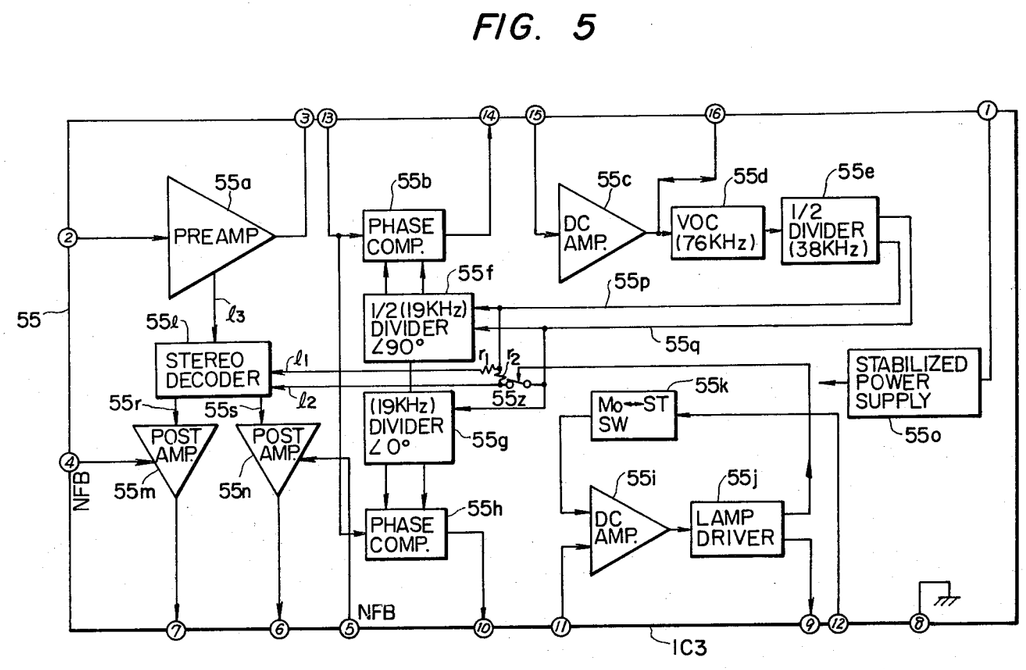
FIG. 5 is a block diagram showing the internal circuit of a third semiconductor integrated circuit to be used in the embodiment shown in FIGS. 2A and 2B.

A third semiconductor integrated circuit IC3 is a semiconductor integrated circuit for PLL (phase-lock loop) FM stereo modulation and can make use of an integrated circuit of the type HA1196, which is sold by Hitachi, Ltd., of Japan. FIG. 5 shows the internal circuit block of that third semiconductor integrated circuit IC3. This third semiconductor integrated circuit IC3 is equipped with a pre-amplifier 55a, a first phase detector 55b, a first direct-current amplifier 55c, a voltage-controlled oscillator 55d, a first divider 55e, a second frequency divider 55f, a third frequency divider 55g, a second phase detector 55h, a second direct-current amplifier 55i, a lamp driver 55j, a monaural-stereo switch circuit 55k, a stereo demodulator 55l, a first post-amplifier 55m, a second post-amplifier 55n, a stabilized power source supply circuit 55o and a switch 55t.

A second terminal acting as the input terminal of the third semiconductor integrated circuit IC3 is connected to receive a stereo composite signal from the sixth terminal of the second semiconductor integrated circuit IC2. This stereo composite signal is amplified by a pre-amplifier 55a and is transmitted to a third terminal. A condenser $C_{134}$ is connected between the third terminal and a thirteenth terminal so that the stereo composite signal at the output terminal of the pre-amplifier 55a is transmitted to the inputs of the first and second phase detectors 55b and 55h.

There is connected between fourteenth and fifteenth terminals a low-pass filter which is composed of a resistor $R_{122}$ and condensers $C_{135}$ and $C_{136}$. The fifteenth terminal acting as the input terminal of the first direct-current amplifier 55c is connected to receive the low-frequency component of the output of the first phase detector 55b through that low-pass filter. That low-frequency component is amplified in a DC manner by the first DC amplifier 55c and is impressed upon the oscillation control terminal of the voltage-controlled oscillator 55d. That oscillation controlled terminal is led out as a sixteenth terminal to the outside of the integrated circuit with the ground potential through a network which is composed of a condenser $C_{137}$ and resistors $R_{120}$ and $R_{121}$. By adjusting the resistance of the resistor $R_{121}$, the free-running oscillation frequency of the voltage-controlled oscillator 55d is determined. This free-running oscillation frequency should be determined at such a frequency as is similar to a value several times as high as the frequency of a pilot signal contained in the stereo composite signal. Since the frequency of the pilot signal is 19 KHz, the free-running oscillation frequency is substantially preset at a frequency of 76 KHz as an example in the present embodiment.

Since the first frequency divider 55e generates an output signal having a half frequency of that of the input signal, there are generated at two signal lines 55p and 55q two signals having a frequency of about 38 KHz, which are opposite in phase to each other and which are equal in amplitude to each other.

The second frequency divider 55f feeds the aforementioned first phase detector 55b with the output signal which has a half frequency of that of the input signals at the aforementioned signal lines 55p and 55q. That first phase detector 55b detects the difference between the phase of the pilot signal of 19 KHz, which is contained in the stereo composite signal obtained from the output terminal of the pre-amplifier 55a, and the phase of the output signal of about 19 KHz, which is obtained from the output terminal of the second frequency divider 55f. Since the error output signal of the first phase detector 55b is transmitted to the voltage-controlled oscillator 55d through the aforementioned low-pass filter and first direct-current amplifier 55c, the output signal of the first frequency divider at the aforementioned two signal lines 55p and 55q has a substantially-accurate frequency of 38 KHz and a phase which is synchronized with the phase of the pilot signal of 19 KHz. The closed loop, which is composed of the aforementioned first phase detector 55b, the low-pass filter, the first direct-current amplifier 55c, the voltage-controlled oscillator 55d, the first frequency divider 55e and the second frequency divider 55f, constitutes the so-called "phase lock loop (PLL)".

The output signal of 38 KHz, which is obtained from the first frequency divider 55e in that phase-lock loop, is fed in opposite phases to each other through the aforementioned two signal lines 55p and 55q to the first and second input terminals $l_1$ and $l_2$ of the stereo demodulator 55l.

If the FM radio-frequency signal received by the FM antenna ANT$_2$ results from an FM stereo broadcasting operation, there is fed out to the sixth terminal of the second semiconductor integrated circuit IC2 a stereo composite signal, in which there is contained a pilot signal having a frequency of 19 KHz having a preset amplitude. On the other hand, in the case where the FM radio-frequency signal received by the FM antenna ANT$_2$ results from an FM monaural broadcasting operation, an FM monaural detected output signal is fed out to the sixth terminal of the second semiconductor integrated circuit IC2, rather than the stereo composite signal. The FM monaural detected output signal no longer contains the pilot signal having a frequency of 19 KHz having a preset amplitude as thus-far described.

In order to detect whether the FM radio-frequency signal received by the FM antenna ANT$_2$ results from an FM stereo broadcasting operation or an FM monaural broadcasting operation, the presence or absence of the pilot signal has to be detected. The third frequency divider 55g and the second phase detector 55h, which are arranged in the third semiconductor integrated circuit IC3, operate as the detector for detecting the existence of that pilot signal. It should be noted that the second phase detector 55h operates as a synchronous detector. During the FM stereo broadcast receiving operation, on the other hand, since the phase of the 38 KHz output signal of the first frequency divider 55e in the aforementioned phase-lock loop is in synchronism with that of the 19 KHz pilot signal in the stereo composite signal, the phase of the 19 KHz output signal of the third frequency divider 55g likewise is in synchronism with that of the 19 KHz pilot signal in the stereo composite signal under that condition. During that FM stereo broadcast reception, consequently, the second phase detector 55h acting as a synchronous detector detects the 19 KHz pilot signal, which is contained in the stereo composite signal impressed upon the thirteen terminal acting as the input terminal thereof, in synchronism with the frequency-divided 19 KHz output signal, which is supplied from the aforementioned third frequency divider 55g, so that the tenth terminal receives a detected output signal which is proportional to the amplitude level of the 19 KHz pilot signal.

During the FM monaural broadcast reception, on the other hand, since the random noise component, which is contained in the FM monaural detected output signal impressed upon the thirteenth terminal, is applied to the second phase detector 55h, the average level of the output voltage of the second phase detector 55h, which is generated at a tenth terminal, is equal to ground potential.

Between the tenth terminal and an eleventh terminal, there is connected a condenser $C_{138}$ which constitutes a part of the low-pass filter. As a result, the low-frequency component of the output of the second phase detector 55h is transmitted to the eleventh terminal which acts as the input terminal of the second direct-current amplifier 55i.

On the other hand, the stereo-monaural circuit 55k has its control input terminal led out as a twelfth terminal to the outside of the integrated circuit. In case that twelfth terminal receives the control voltage at a high level, the output signal of the stereo-monaural switch circuit 55k forcibly prohibits the amplification of the second direct-current amplifier 55i. On the other hand, in the case where the control voltage at the low level is impressed upon the twelfth terminal, the second direct-current amplifier 55i carries out a preset amplification. That twelfth terminal is connected with the fourth change-over switch SW$_4$ through a resistor $R_{123}$.

The lamp driver 55j has a threshold at the input characteristics for the output signal of the second direct-current amplifier 55i. In the case where the output signal of the second direct-current amplifier 55i is at a level having such a value as exceeds that threshold, the lamp driver 55i turns on a stereo indicator lamp 56 which is connected with a ninth terminal through a resistor $R_{124}$. The lighting of that stereo indicator lamp 56 indicates that the FM tuner is receiving an FM stereo broadcast signal. On the other hand, the non-lighting of that stereo indicator lamp 56 indicates not only that the FM tuner is receiving an FM monaural broadcast signal, but also that it is under either of the following two conditions.

More specifically, in the case where the fourth changeover switch SW$_4$ is closed to the MONO side, the positive power supply voltage $V_{cc}$ is impressed as the control signal at the high voltage level upon the twelfth terminal through the switch SW$_4$ under that condition and through the resistor $R_{123}$. Thus, since the output signal of the stereo-monaural switch circuit 55k forcibly prohibits the amplification of the second direct-current amplifier 55i, the lamp driver 55j partly turns off the stereo indicator lamp 56, which is connected with the ninth terminal, and partly controls the switch 55t, which is connected between the second output signal line 55q of the first frequency divider 55e and the second input terminal $l_2$ of the stereo demodulator 55l, into its open condition. Since the 38 KHz output signal appearing on the first signal line 55p of the first frequency divider 55e drives the first and second input terminals $l_1$ and $l_2$ of the stereo demodulator 55l in the in-phase mode through resistors $r_1$ and $r_2$, no stereo demodulation is carried out by the stereo demodulator 55l.

On the other hand, in the case where the fourth change-over switch SW$_4$ is closed to the AUTO side, the voltage at the twelfth terminal of the second semiconductor integrated circuit IC2 is applied to the twelfth terminal of the third semiconductor integrated circuit IC3 through the fourth change-over switch SW$_4$ under that condition and through the resistor $R_{116}$. Whether the level of the FM intermediate-frequency signal impressed upon the first terminal of the second semiconductor integrated circuit IC2 becomes equal to or lower than a preset value so that the signal-to-noise ratio is remarkably deteriorated or whether the detuned frequency from the S-letter characteristic center frequency of the aforementioned FM detector exceeds a preset value range, there appears an output voltage of a high level at the twelfth terminal of the second semiconductor integrated circuit IC2. As a result, the gain of the audio amplifier 54*l* of the second semiconductor integrated circuit IC2 is controlled to a substantially-zero condition, and at the same time the lamp driver 55*j* of the third semiconductor integrated circuit IC3 partly turns out the stereo indicator lamp 56 and partly controls the switch 55*t*, which is connected between the second output signal line 55*q* of the first frequency divider 55*e* and the second input terminal $I_2$ of the stereo demodulator 55*l*, into its open condition.

On the other hand, in the case where the lamp driver 55*j* turns on the stereo indicator lamp 56, it controls the aforementioned switch 55*t* into its closed condition. The anti-phase 38 KHz output signal at the first and second output signal lines 55*p* and 55*q* of the first frequency divider 55*e* drives the first and second input terminals $I_1$ and $I_2$ of the stereo demodulator 55*l* in the opposite phase modes to each other. Those first and second input terminals $I_1$ and $I_2$ are driven with opposite phases by the 38 KHz signal so that the stereo demodulator 55*l* can accomplish its stereo switching demodulation.

The other input terminal $I_3$ of the stereo demodulator 55*l* is fed with the stereo composite signal from the pre-amplifier 55*a*, and the first and second input terminals $I_1$ and $I_2$ of the same are fed with the 38 KHz switching signals with opposite phases so that the stereo demodulator 55*l* feeds out a left-channel demodulated output signal and a right-channel demodulated output signal to a first output terminal 55*r* and a second output terminal 55*s* thereof, respectively. A stereo demodulator of this switching type is reported on pages 58–73, Volume BTR-14 Number 3, *IEEE Transactions on Broadcast and Television Receivers*, which was published in October, 1968. Moreover, a semiconductor integrated circuit for FM stereo demodulation, which uses the phase-lock loop, is reported on pages 62 to 66 of the November, 1971, issue of *Electronics*.

The left- and right-channel demodulated signals at the first and second output terminals 55*r* and 55*s* of the stereo demodulator 55*l* are amplified by the first and second post-amplifiers 55*m* and 55*n*, respectively, and are transmitted to a seventh terminal and a sixth terminal, respectively. The first and second post-amplifiers 55*m* and 55*n* are led out as negative feedback terminals to the outside of the integrated circuit. A first terminal and the fourth and seventh terminals are connected with a network which is composed of resistors $R_{125}$, $R_{126}$ and $R_{127}$ and condensers $C_{138}$ and $C_{139}$, so that the gain of the first post-amplifier 55*m* is determined thereby. Likewise, the first, fifth and sixth terminals are connected with a network, which is composed of resistors $R_{128}$, $R_{129}$ and $R_{130}$ and condensers $C_{140}$ and $C_{141}$, so that the gain of the second post-amplifier 55*n* is determined by this network.

The left-channel demodulated output signal, which is obtained from the seventh terminal, is transmitted to a terminal $T_3$ through a condenser $C_{142}$, a resistor $R_{131}$ and a low-pass filter 57, whereas the right-channel demodulated output signal, which is obtained from the sixth terminal, is transmitted to a terminal $T_4$ through a condenser $C_{143}$, a resistor $R_{132}$ and a low-pass filter 58. Those terminals $T_3$ and $T_4$ are connected to ground potential through resistors $R_{133}$ and $R_{134}$, respectively. The first terminal of the third semiconductor integrated circuit IC3 is connected to receive the positive power source voltage $V_{cc}$ so that the stabilized power source supply circuit 55*o* feeds the stabilized operation voltage to the third semiconductor integrated circuit IC3.

The oscillation control terminal of the voltage-controlled oscillator 55*d* is led out as the sixteenth terminal to the outside of the integrated circuit and is connected at the outside of the integrated circuit to ground potential through a resistor $R_{135}$ and a transistor TR1. The AM side terminal of the second change-over switch SW2 is connected to ground potential through resistors $R_{136}$ and $R_{137}$. Moreover, the common node of the resistors $R_{136}$ and $R_{137}$ is connected to the base electrode of the aforementioned transistor TR1.

During AM broadcast reproduction, since that second change-over switch SW2 is closed at the AM side, there is generated at the common node of the aforementioned resistors $R_{136}$ and $R_{137}$ a divided voltage which is determined by dividing the positive power source voltage $V_{cc}$ at a ratio of those resistances. The voltage thus divided renders the aforementioned transistor TR1 conductive so that the potential at the sixteenth terminal takes a relatively-low level. Thus, the sixteenth terminal of the third semiconductor integrated circuit IC3 is preset at the potential of the relatively-low level so that the oscillating operation of the voltage-controlled oscillator 55*d* of that integrated circuit IC3 is forcibly prohibited. In these ways, the circuit operation of the phase-lock loop in the third semiconductor integrated circuit IC3 is stopped during AM broadcast reproduction.

During FM broadcast reproduction, since the second change-over switch SW2 is closed at the FM side, the positive power source voltage $V_{cc}$ is fed to the local oscillator 52*c* in the FM front end 52 through the second change-over switch SW2 under that condition. Thus, the operation of the FM front end 53 is made possible.

During AM broadcast reproduction, a fifth change-over switch SW5 is closed at the side of the terminal $T_1$, and a sixth change-over switch SW6 is closed at the side of the terminal $T_2$. These terminals $T_1$ and $T_2$ are connected to receive the AM detected output signal which is obtained from the twelfth terminal of the first semiconductor integrated IC1.

During FM broadcast reproduction, the fifth change-over switch SW5 is closed at the side of the terminal $T_3$, and the sixth change-over switch SW6 is closed at the side of the terminal $T_4$. The former terminal $T_3$ is connected to receive the left-channel demodulated output signal from the seventh terminal of the third semiconductor integrated circuit IC3. On the other hand, the latter terminal $T_4$ is connected to receive the right-channel demodulated output signal from the sixth terminal of the third semiconductor integrated circuit IC3.

A fourth semiconductor integrated circuit IC4 shown in FIG. 2B is a semiconductor integrated circuit for a voltage-controlled attenuator, which is used as a variable gain circuit, and make use of the integrated circuit of type HA12022, which is described in detail in applicant's copending U.S. application Ser. No. 152,295, which is entitled "Signal Transmission Circuit".

The fourth semiconductor integrated circuit IC4 has its first, sixth, tenth, eighth, thirteenth and third terminals acting as a first signal input terminal, a second signal input terminal, a first signal output terminal, a second signal output terminal, a first control input terminal and a second control input terminal, respectively. The signal transmission from the first signal input terminal to the first signal output terminal can be controlled by the control voltage which is impressed upon the first control input terminal. Likewise, the signal transmission from the second signal input terminal to the second signal output terminal can be controlled by the second control voltage.

Figure 6:
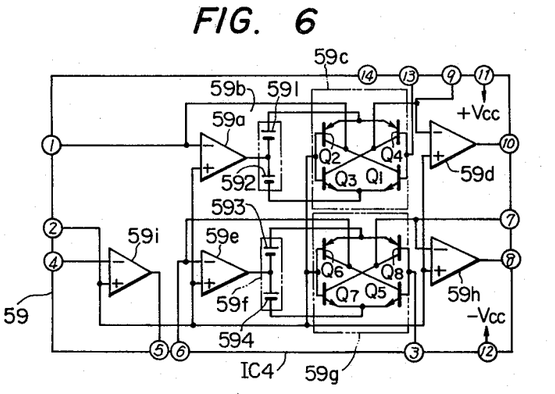
FIG. 6 is a block diagram showing the internal circuit of a fourth semiconductor integrated circuit to be used in the embodiment shown in FIGS. 2A and 2B.

FIG. 6 shows the internal circuit configuration of that fourth semiconductor integrated circuit IC4. This fourth semiconductor integrated circuit IC4 is equipped with a first operational amplifier 59a, a first level shift circuit 59b, a first transistor network 59c, a second operational amplifier 59d, a third operational amplifier 59e, a second level shift circuit 59f, a second transistor network 59g, a fourth operational amplifier 59h and a fifth operational amplifier 59i.

The first operational amplifier 59a has its inverting input terminal (−) and non-inverting input terminal (+) connected to the first and second terminals, respectively. This second terminal is connected at the outside of the integrated circuit to ground potential. The output signal of the first operational amplifier 59a is connected to the first transistor network 59c through level shift elements 591 and 592 of the first level shift circuit 59b.

The first transistor network 59c is composed of NPN transistors $Q_1$ and $Q_2$ and PNP transistors $Q_2$ and $Q_4$. The transistors $Q_1$ and $Q_2$ have their collectors connected commonly with each other and with the inverting input terminal (−) of the first operational amplifier 59a. On the other hand, the transistors $Q_3$ and $Q_4$ have their collectors connected in common with each other and with the inverting input terminal (−) of the second operational amplifier 59d. Both the bases of the transistors $Q_2$ and $Q_3$ are connected to the second terminal. On the other hand, both the bases of the transistors $Q_1$ and $Q_4$ are connected to the thirteenth terminal.

The second operational amplifier 59d has its inverting input terminal (−) connected to both the collectors of the transistors $Q_3$ and $Q_4$ and led out as a ninth terminal to the outside of the integrated circuit. The non-inverting input terminal (+) and the output terminal of the second operational amplifier 59d are connected to a second terminal and the tenth terminal, respectively.

The third operational amplifier 59e has its inverting input terminal (−) and non-inverting input terminal (+) connected to the sixth and second terminals, respectively. The output signal of the third operational amplifier 59e is connected to the second transistor network 59g through level shift elements 593 and 594 of the second level shift circuit 59f.

The second transistor network 59g is composed of NPN transistors $Q_5$ and $Q_7$ and PNP transistors $Q_6$ and $Q_8$. The transistors $Q_5$ and $Q_6$ have both their collectors connected in common with each other and with the inverting input terminal (−) of the third operational amplifier 59e. On the other hand, the transistors $Q_7$ and $Q_8$ have both their collectors connected in common with each other and with the inverting input terminal (−) of the fourth operational amplifier 59h. Both the bases of the transistors $Q_6$ and $Q_7$ are connected to the second terminal. On the other hand, both the bases of the transistors $Q_5$ and $Q_8$ are connected to the third terminal.

The fifth operational amplifier 59i, which is not used in the present embodiment, is arranged inside of the integrated circuit and has its inverting input terminal (−), non-inverting input terminal (+) and output terminal connected to a fourth terminal, the second terminal and a fifth terminal, respectively.

Outside of the integrated circuit, the first and sixth terminals are connected to the fifth change-over switch $SW_5$ and the sixth change-over switch $SW_6$, respectively, through resistors $R_{138}$ and $R_{139}$. Outside of the integrated ciruit, moreover, the thirteenth and third terminals are commonly connected with each other and are commonly fed with a control voltage $V_c$. The positive power source voltage $+V_{cc}$ and the negative power source voltage $-V_{cc}$ are fed to the five operational amplifiers 59a, 59d, 59e, 59h and 59i through eleventh and twelfth terminals, respectively. A resistor $R_{141}$ and a condenser $C_{144}$ are connected in parallel between the ninth and tenth terminals. On the other hand, a resistor $R_{142}$ and a condenser $C_{145}$ are connected in parallel between a seventh terminal and the eighth terminal.

Such relationships as are expressed by the following equations hold among a first input signal current $i_{in}$ which flows through the first terminal, a second input signal current $i'_{in}$ which flows through the sixth terminal, a first output signal current $i_{out}$ which flows through the ninth terminal, a second output signal current $i'_{out}$ which flows through the seventh terminal, the absolute value $|V_c|$ of the control voltage $V_c$ at the thirteenth and third terminals, a first input signal voltage $v_{in}$ at the one end of the resistor $R_{138}$, a second input signal voltage $v'_{in}$ at one end of the resistor $R_{139}$, a first output signal voltage $v_{out}$ at the tenth terminal, and a second output signal voltage $v'_{out}$ at the eighth terminal:

$$i_{out} = i_{in} \cdot \exp \frac{q(-V_c)}{kT} \tag{1}$$

$$i'_{out} = i_{in} \cdot \exp \frac{q(-V_c)}{kT} \tag{2}$$

$$V_{in}=R_{138}\cdot i_{in}, \ V'_{in}=R_{139}\cdot i'_{in} \tag{3}$$

and $$v_{out}=R_{141}\cdot i_{out}, \ v'_{out}=R_{142}\cdot i'_{out} \tag{4}$$

As is apparent from the foregoing description, therefore, the first and second output signal voltages $v_{out}$ and $v'_{out}$ at the tenth and eighth terminals are exponentially decreased with an increase in the absolute value $|V_c|$ of the control voltage $V_c$. The first output signal voltage $v_{out}$ is transmitted to the input terminal of a first power amplifier 60 through a tone control condenser $C_{146}$, a variable resistor $R_{143}$ and a sound volume adjusting variable resistor $R_{145}$. A first speaker 61 for the stereo left channel is driven by the amplified output signal of the first power amplifier 60.

Likewise, the second output signal voltage $v'_{out}$ is transmitted to the input terminal of a second power amplifier 62 through a tone control condenser $C_{147}$, a variable resistor $R_{144}$ and a sound volume adjusting variable resistor $R_{146}$. A second speaker 63 for the stereo right channel is driven by the amplified output signal of the second power amplifier 62.

According to the present invention, as shown in FIGS. 2A and 2B, the tuning meter TM is connected to the non-inverting input terminal (+) of an operational amplifier 64 which acts as a voltage comparator. The inverting input terminal (−) of that operational amplifier 64 is connected to receive a reference voltage $V_{REF}$. In order to generate this reference voltage $V_{REF}$, a resistor $R_{147}$ and a constant voltage Zener diode ZD are connected in series between the positive power source voltage $+V_{cc}$ and ground potential. A variable resistor $R_{148}$ is connected in parallel with the constant voltage Zener diode ZD so that the reference voltage $V_{REF}$ can be obtained from the variable intermediate tap of the variable resistor $R_{148}$.

The output terminal of the operational amplifier 64 is connected to a control input terminal 69 of a seventh change-over switch $SW_7$. When the control input terminal 69 is supplied with a voltage at a high level, the seventh change-over switch $SW_7$ transmits only the voltage, which is impressed upon a first input terminal 70, to an output terminal 72. On the contrary, when the control input terminal 69 is supplied with a voltage at a low level, the seventh change-over switch $SW_7$ transmits only the voltage, which is impressed upon the second input terminal 71, to the output terminal 72. The seventh change-over switch $SW_7$ is composed of a first switch unit 65 and a second switch unit 66.

These first and second switch units 65 and 66 are similarly composed of a CMOS analog switch. Specifically, the first switch unit 65 is composed of an N channel MOSFET 65a and a P channel MOSFET 65b, the source drain passes of which are connected in parallel, and a first inverter 65c, which is connected between the gates of the two MOSFETs 65a and 65b. Likewise, the second switch unit 66 is composed of an N channel MOSFET 66a and a P channel MOSFET 66b, the source-drain passes of which are connected in parallel, and a second inverter 66c, which is connected between the gates of those two MOSFETs 66a and 66b.

The first input terminal 70 of the seventh change-over switch $SW_7$ is connected to an output terminal 67a of a noise detector 67 for detecting the noises in a sound field 68. The second input terminal 71 of the seventh change-over switch $SW_7$ is connected to receive the positive power source voltage $V_{cc}$ so as to carry out the forced attenuation.

A first microphone 67b and a second microphone 67c of the noise detector 67 are arranged in the sound field 68 extending in the passenger compartment of an automobile. The surrounding noises such as the engine noises from the engine of the automobile or the road noises outside of the automobile are transmitted to the sound field 68 or to the passenger compartment of the automobile. These surrounding noises exhibit relatively-large changes.

The noise detector 67 is further composed of a first pre-amplifier 67d, a second pre-amplifier 67e, a first operational amplifier 67f, a second operational amplifier 67g, a first envelope detector 67h, a second envelope detector 67i, a first integration circuit 67j, a second integration circuit 67k and an adder 67l. This adder 67l is composed of resistors $R_{149}$, $R_{150}$ and $R_{151}$, an inverting amplifier 73 and a level shift circuit 74.

The output signal of the first microphone 67b and the output signal of the second microphone 67c are transmitted through the first pre-amplifier 67d and the second pre-amplifier 67e, respectively, to the non-inverting input terminal (+) of the first operational amplifier 67f and the non-inverting input terminal (+) of the second operational amplifier 67g.

The output signal of the first operational amplifier 67f and the output signal of the second operational amplifier 67g are transmitted to the adder 67l through the first envelope detector 67h and the first integration circuit 67j and through the second envelope detector 67i and the second integration circuit 67k, respectively.

Since the adder 67l is provided in the form of an analog adder formed of the resistors $R_{149}$, $R_{150}$ and $R_{151}$, the inverting amplifier 73 and the level shift circuit 74, it supplies the output terminal 67a with an output component which is the summation of the output of the first microphone 67b and the output of the second microphone 67c.

According to the preferred embodiment, the audio amplified signal of the first power amplifier 60 is impressed upon the inverting input terminal (−) of the first operational amplifier 67f, whereas the audio amplified signal of the second power amplifier 62 is impressed upon the inverting input terminal (−) of the second operational amplifier 67g. As a result, the first and second operational amplifiers 67f and 67g offset the audio amplified signal, which is contained in the output signal of the first pre-amplifier 67d, and the audio amplified signal, which is contained in the output signal of the second pre-amplifier 67e, in response to the audio amplified signals which are impressed upon their respective inverting input terminal (−). Thus, neither the audio signal of the first speaker 61 nor the audio signal of the second speaker 63 are substantially transmitted to the output terminal 67a of the noise detector 67, but the surrounding noise component in the sound field 68 or the passenger room are transmitted to that output terminal 67a.

Such relationships as are expressed by the following equation hold among a noise detection signal voltage $v_j$ at the output terminal of the first integration circuit 67j, a noise detection signal voltage $v_k$ at the output terminal of the second integration circuit 67k, and a voltage $v_{73}$ at the output terminal of the inverting amplifier 73:

$$v_{73} = -\left[ \frac{R_{151}}{R_{149}} v_k + \frac{R_{151}}{R_{150}} v_j \right] \tag{5}$$

If the resistances of the resistors $R_{149}$, $R_{150}$ and $R_{151}$ are preset to be equal to one another, the voltage $v_{73}$ is given by the following equation:

$$v_{73} = -(v_k + v_j) \tag{6}$$

Figure 7:
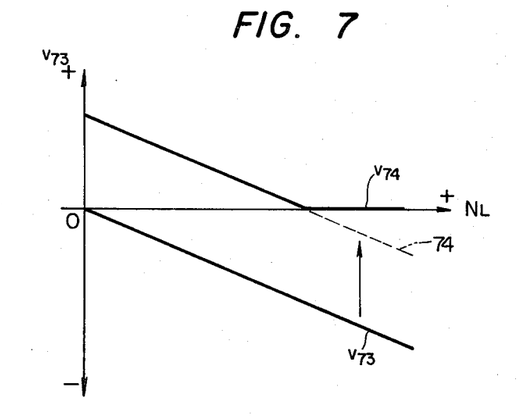
FIG. 7 is a characteristic diagram illustrating the relationship in the embodiment of FIGS. 2A and 2B between the surrounding noise level $N_L$ in a sound field and the output voltage $V_{74}$ of a noise detector 67.

As a result, the relationship between the output voltage $v_{73}$ of the inverting amplifier 73 and the surrounding noise level $N_L$ of the sound field 68 or the passenger compartment is as illustrated in FIG. 7. Specifically, the output voltage $v_{73}$ in case the surrounding noise level $N_L$ of the sound field 68 is low substantially takes the ground potential level, whereas the output voltage $v_{73}$ in case that surrounding noise level $N_L$ is high takes a negative potential level. The level shift circuit 74 feeds the output terminal 67a with an output voltage $v_{74}$ which has its level shifted by a preset potential from that output voltage $v_{73}$, but the minimum potential of the output voltage $v_{74}$ is limited to the ground potential (at zero volt). The relationship between the output voltage $v_{74}$ of that level shift circuit 74 and the surrounding noise level $N_L$ of the sound field 68 is likewise illustrated in FIG. 7.

On the other hand, the first change-over switch $SW_1$ connected with the tuning meter TM is closed to the AM side during AM broadcast reproduction and is closed at the FM side during FM broadcast reproduction. As a result, the tuning meter TM is supplied either with that component of the AM broadcast received signal, which is dependent upon the level of the AM detected output signal, or that component of the AM broadcast received signal, which is dependent upon the level of the FM intermediate-frequency signal. In case the AM or FM broadcast signal under the preferred condition is being received, that tuning meter TM is supplied with the tuning meter drive voltage which is proportional to the level of the received signal.

Under this preferred condition, the tuning meter drive voltage is at a higher lever than the reference voltage $V_{REF}$ which is impressed in advance upon the inverting input terminal (−) of the operational amplifier 64 acting as the voltage comparator. Under this condition, the output voltage at the output terminal of the operational amplifier 64, which is connected with the control input terminal 69 of the seventh change-over switch SW₇, takes the high level so that the seventh change-over switch SW₇ has its first switch unit 65 turned on and its second switch unit 66 turned off. As a result, the output voltage $V_{74}$ at the output terminal 67a of the noise detector 67 is fed through the output terminal 72 of the seventh change-over switch SW₇ to the third and thirteenth terminals of the fourth semiconductor integrated circuit IC4.

Under this preferred condition, in case the surrounding noise level $N_L$ of the sound field or the passenger compartment is high, the output voltage $v_{74}$ of the noise detector 67, which is supplied to the third and thirteenth terminals of the fourth semiconductor integrated circuit IC4, is substantially at the ground potential (or zero volt) level so that the signal attenuation during the signal transmission from the first terminal to the tenth terminal and during the signal transmission from the sixth terminal to the eighth terminal is remarkably low. As a result, in case the surrounding noise level $N_L$ of the sound field 68 is high, the first and second speakers 61 and 63 are driven by the audio amplified output signal at the high level.

Under such preferred condition, when the surrounding noise level $N_L$ of the sound field 68 or the passenger compartment is lowered, the aforementioned output voltage $v_{74}$ is raised to the high level so that the signal attenuation during the signal transmission from the first terminal to the tenth terminal and during the signal transmission from the sixth terminal to the eighth terminal is increased. As a result, when the surrounding noise level $N_L$ of the sound field 68 is lowered, the first and second speakers 61 and 63 are driven by the audio amplified output signal at the low level.

On the contrary, in case the automobile is running in a tunnel, for example, substantially neither the AM radio-frequency signal nor the FM radio-frequency signal are received by the AM and FM antennas ANT₁ and ANT₂. As a result, the tuning meter TM is supplied with a weak voltage which is the noise component. All that appears in the AM detected output signal, which is obtained from the twelfth terminal of the first semiconductor integrated circuit and which is fed to the terminal T₁ of the fifth change-over switch SW₅ and to the terminal T₂ of the sixth change-over switch SW₆, is substantially the noise component. During the running operation in the tunnel, moreover, the audio muting operation is carried out at the second semiconductor integrated circuit IC2 by the control of the audio mute control amplifier 54n so that the stereo composite signal is not present but the noise component appears at the sixth terminal. The noise component at the sixth terminal of the second semiconductor integrated circuit IC2 is transmitted to the second terminal of the third semiconductor integrated circuit IC3. This noise component transmitted to the second terminal does not contain any substantial pilot signal component of 19 KHz.

During such running operation in the tunnel, on the other hand, the stereo demodulator 55l of the third semiconductor integrated circuit IC3 does not carry out the stereo demodulation but transmits that noise component of the second terminal, which is amplified by the pre-amplifier 55a, to the first and second post-amplifiers 55m and 55n. As a result, the noise component, which is further amplified by the post-amplifiers, appears at the seventh and sixth terminals of that integrated circuit IC3 so that it correspondingly appears at the terminal T₃ of the fifth change-over switch SW₅ and at the terminal T₄ of the sixth change-over switch SW₆.

The fifth and sixth change-over switches SW₅ and SW₆ are selectively closed to the AM or FM side. In either selection, the aforementioned noise component is transmitted during the running operation in the tunnel to the first and sixth terminals of the fourth semiconductor integrated circuit IC4. If, under that condition, the seventh change-over switch SW₇ should have its first switch unit 65 maintained in the conductive condition and its second switch unit 66 maintained in a non-conductive condition, an auditorily-uncomfortable feeling results.

Specifically, the aforementioned noise component, which is transmitted from the first terminal to the tenth terminal of the fourth semiconductor integrated circuit IC4, and the aforementioned noise component, which is transmitted from the sixth terminal to the eighth terminal, are amplified by the first and second power amplifiers 60 and 62, respectively, and are transmitted to the first and second speakers 61 and 63, respectively. When that surrounding noise level $N_L$ of the sound field 68, which is dependent upon the engine noise or the road noise, is raised, the output voltage $v_{74}$ at the output terminal 67a of the noise detector 67 is lowered to ground potential so that the attenuation during the signal transmission from the first terminal to the tenth terminal and during the signal transmission from the sixth terminal to the eighth terminal is lowered. In this case, an undesired phenomena results in that the noise voltages dependent upon the noise components impressed upon the aforementioned first and sixth terminals are generated at high levels from the first and second speakers 61 and 63, respectively.

According to the present invention, the tuning meter drive voltage of the tuning meter TM is impressed upon the non-inverting input terminal (+) of the operational amplifier 64. During the running operation in the tunnel, that tuning meter drive voltage becomes such a weak voltage or the noise component that its level becomes equal to or lower than the aforementioned reference voltage $V_{REF}$.

As a result, the output voltage of the operational amplifier 64, which is connected with the control input terminal 69 of the seventh change-over switch SW₇, takes a low level so that the seventh change-over switch SW₇ has its first switch unit 65 turned off and its second switch unit 66 turned on. Thus, the positive power source voltage $+V_{cc}$, which is fed to the second input terminal 71 of the seventh change-over switch SW₇, is fed through the output terminal 72 of that switch SW₇ to the third and thirteenth terminals of the fourth integrated circuit IC4, so that the signal attenuation, during the signal transmission from the first terminal to the tenth terminal of that integrated circuit IC4 and during the signal transmission from the sixth terminal to the eighth terminal, becomes remarkably high.

According to the present invention, therefore, during the running operation in the tunnel, little noise voltage is generated from the first and second speakers 61 and 63 so that the undesired result thus-far described can be prevented.

The present invention should not be limited to the aforementioned two embodiments but can make use of modes of embodiments which are modified in various manners in accordance with the concept thereof.

What is claimed is:

1. A receiving reproducing system comprising:
   an antenna;
   a signal processing circuit connected to said antenna for providing a detected output signal from a radio-frequency signal which is received by said antenna;
   power amplifier means for amplifying the detected output signal of said signal processing circuit;
   a speaker connected to be driven by said amplified output signal;
   a variable gain circuit connected between said signal processing circuit and said power amplifier means;
   noise detector means for detecting the surrounding noise level of a sound field;
   received level detector means for detecting a level which is dependent upon the received signal level of said antenna; and
   control means connected between said noise detector means and said variable gain circuit, said control means controlling the gain of said variable gain circuit in case the output signal of said received level detector means is higher than a preset value so as to control the level of said amplified output signal in proportion to the surrounding noise level of said sound field in response to the output signal of said noise detector means and said control means forcibly lowering the level of said amplified output signal in case said output signal of said received level detector means is lower than said preset value;
   wherein said antenna includes an AM antenna and an FM antenna; wherein said signal processing circuit includes an AM tuner for obtaining an AM detected output signal from an AM radio-frequency signal which is received by said AM antenna, an FM front end for obtaining an FM intermediate-frequency signal from an FM radio-frequency signal which is received by said FM antenna, an FM intermediate-frequency signal processing circuit for obtaining an FM detected output signal from said FM intermediate-frequency signal, and an FM stereo demodulator enabled to obtain a left-channel demodulated output signal and a right-channel demodulated output signal from said FM detected output signal; wherein said power amplifier means includes a first power amplifier and a second power amplifier; wherein said speaker includes a first speaker and a second speaker which are driven by the output signal of said first power amplifier and the output signal of said second power amplifier, respectively; wherein said variable gain circuit includes a voltage-controlled attenuator having its signal transmission from a first input terminal to a first output terminal controllable by a control voltage, which is to be impressed upon a first control input terminal, and its signal transmission from a second input terminal to a second output terminal controllable by a control voltage which is to be impressed upon a second control input terminal, the first input terminal and the second input terminal of said voltage-controlled attenuator being selectively fed with either the AM detected output signal, which is obtained from said AM tuner, or the left- and right-channel demodulated output signal which are obtained from said FM stereo demodulator by way of a selection means, the first output terminal and the second output terminal of said voltage-controlled attenuator being connected with an input terminal of said first power amplifier and an input terminal of said second power amplifier, respectively; wherein said received level detector means includes a tuning meter circuit in said AM tuner and a tuning meter circuit in said FM intermediate-frequency signal processing circuit; wherein said control means includes a voltage comparator to be fed with a tuning meter drive voltage from one of said tuning meter circuits and a reference voltage which corresponds to said preset value wherein said control means further includes a change-over switch having a first input terminal connected to receive the output voltage of said noise detector means, a second input terminal connected to receive a control voltage for forced attenuation, and output terminals connected to the first and second control input terminals of said voltage-controlled attenuator; and wherein the output of said voltage comparator controls said change-over switch, in case said tuning meter drive voltage is higher than said reference voltage, to impress the output voltage of said noise detector means upon the first and second control input terminals of said voltage-controlled attenuator, and impresses said control voltage for forced attenuation upon the first and second control input terminals of said voltage-controlled attenuator in case said tuning meter drive voltage is lower than said reference voltage, thereby disabling sound field effects on said power amplifier output signals.

2. A receiving reproducing system according to claim 1, wherein said noise detector means includes a microphone, a pre-amplifier for amplifying the output signal of said microphone, a subtraction circuit connected to receive the output signal of said pre-amplifier and an audio signal of one of said power amplifiers, a detector connected to the output of said subtraction circuit, and an integration circuit connected with the output of said detector, the output signal of said integration circuit being utilized as an output signal of said noise detector means.

3. A receiving reproducing system according to claim 1, wherein at least said antennas, said speakers and said noise detector means form a mobile unit.

4. A receiving reproducing system comprising:
   an AM tuner for obtaining an AM detected output signal from an AM radio-frequency signal;
   an FM front end for obtaining an FM intermediate-frequency signal from an FM radio-frequency signal;
   an FM intermediate-frequency signal processing circuit for obtaining an FM detected output signal from said FM intermediate-frequency signal;
   an FM stereo demodulator for obtaining a left-channel demodulated output signal and a right-channel demodulated output signal from said FM detected output signal;

a first terminal which can be supplied by way of a selection means with a selected one of said AM detected output signal and said left-channel demodulated output signal;

a second terminal which can be supplied by way of said selection means with a selected one of said AM detected output signal and said right-channel demodulated output signal;

a first voltage-controlled attenuator having an input terminal, a control terminal and an output terminal, the signal transmission from said input terminal to said output terminal being controllable by a control voltage impressed upon said control terminal and said input terminal being connected to said first terminal;

a second voltage-controlled attenuator having an input terminal, a control terminal and an output terminal, the signal transmission from said input terminal to said output terminal being controllable by a control voltage impressed upon said control terminal and said input terminal being connected to said second terminal;

a first power amplifier the input terminal of which is connected with said output terminal of said first voltage-controlled attenuator;

a second power amplifier the input terminal of which is connected with said output terminal of said second voltage-controlled attenuator;

a first speaker which is driven by the output signal of said first power amplifier;

a second speaker which is driven by the output signal of said second power amplifier;

noise detector means for detecting the surrounding noise level of a sound field;

received level detector means for detecting an AM level which is dependent upon said AM radio-frequency signal as well as an FM level which is dependent upon said FM radio-frequency signal, and control means responsive to an output signal of said received level detector means and connected between the output terminal of said noise detector means and both of said control terminals of said first and second voltage controlled attenuator, said control means including means for transmitting the detected output of said noise detector means to both of said control terminals of said first and said second voltage controlled attenuator in case the output signal of said received level detector means is higher than a preset value so as to control said output signals of said first and second power amplifier proportionally in accordance with said surrounding noise level of said sound field and said control means forcibly lowering the level of said output signals of said first and second power amplifier in case said output signal of said received level detector means is lower than said preset value, thereby disabling sound field effects on said power amplifier output signals.

5. A receiving reproducing system according to claim 4, wherein said FM intermediate-frequency signal processing circuit includes audio mute control amplifier means for causing said FM detected output signal to become zero when the level of said FM intermediate-frequency signal is lower than a predetermined value.

* * * * *